United States Patent
Zapf

[11] Patent Number: 6,106,894
[45] Date of Patent: *Aug. 22, 2000

[54] METHOD FOR IMPROVING THE PROTECTION AGAINST CORROSION OF A SURFACE COATED WITH ALUMINUM

[75] Inventor: Lothar Zapf, Alzenau, Germany

[73] Assignee: Vacuumschmelze GmbH, Hanau, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/812,414

[22] Filed: Mar. 6, 1997

[30] Foreign Application Priority Data

Mar. 6, 1996 [DE] Germany ............... 196 08 731

[51] Int. Cl.⁷ ........................................ B05D 5/12
[52] U.S. Cl. .............. 427/127; 427/250; 427/383.1; 427/383.3; 427/124
[58] Field of Search ............... 427/250, 372.2, 427/383.3, 127, 383.1, 124

[56] References Cited

U.S. PATENT DOCUMENTS 4,935,080  6/1990  Hassell et al. ............... 156/154
5,399,438  3/1995  Tateishi et al. .

FOREIGN PATENT DOCUMENTS 0 143 731  6/1985  European Pat. Off. .
915452  1/1963  United Kingdom .

OTHER PUBLICATIONS

Qin et al, J. Appl. Phys. 79(8) pp. 4854–4856, Apr. 15, 1996.
T. Minowa, "Coating Technology on Nd Magnet", Gorham International Conference, Feb. 26–28, 1989. No page number available!.
Abstract of Soviet Union 549266 of May 30, 1977. No page number available!.
Ahmed et al, "Ion Vapour Deposition for Corrosion Protection of Permanent Magnets", *ERA Technol.* XP00007505, Letterhead, UK, Jun. 20–21, 1989, pp. 8.3.1–8.3.9.

*Primary Examiner*—Roy V. King
*Attorney, Agent, or Firm*—Hill & Simpson

[57] ABSTRACT

NdFeB magnets are very sensitive to corrosion and are provided, among other things, with a layer of aluminum in order to improve their resistance to corrosion. To improve the resistance of an aluminum-coated article, such as the NdFeB magnet, the magnet with the aluminum coating is subjected to a heat treatment at a temperature lower than the melting temperature of the aluminum, which heat treatment improves the resistance to corrosion when subjected to a humid atmosphere at an elevated temperature.

7 Claims, No Drawings

METHOD FOR IMPROVING THE PROTECTION AGAINST CORROSION OF A SURFACE COATED WITH ALUMINUM

BACKGROUND OF THE INVENTION

The present invention is directed to a method for improving the protection against corrosion of surfaces that are coated with aluminum or an alloy consisting predominantly of aluminum.

Magnets, in particular magnets that contain rare earth, for example NdFeB magnets, will exhibit a strong tendency to corrode due to their affinity to oxygen. During the use of parts of this type of magnet in atmospheres that promote corrosion, such as, for example, in an atmosphere with a high humidity or an atmosphere containing salt, it is thus necessary to protect the magnetic material by means of a coating that inhibits corrosion. For this purpose, besides lacquering processes, coatings with nickel, tin or aluminum are standard.

An article by T. Minowa entitled "Coating Technology on Nd Magnets" *Gorham International Conference*, Monterey, Calif., Feb. 26–28, 1989, discusses coatings to protect Nd magnets. A coating with aluminum can be provided by what is known as an ion plating method, which is also called IVD, wherein the IVD stands for "ion vapor deposition. Here, the aluminum is vaporized and is deposited on the surface of a negatively-charged part with a voltage of 1 kV to 5 kV. Besides this, the galvanic depositing of aluminum from anhydrous electrolyte solutions is possible. Depositing can also take place onto any other known type of aluminum layer on a magnet of this type, and also onto other parts.

It is also theoretically possible to use aluminum alloys rather than pure aluminum for coating, which alloys should then, however, consist predominantly of aluminum. Magnets with this sort of coating have a particular advantage against corrosion in atmospheres containing salt. In environments of this sort, aluminum is more resistant against corrosion than parts coated with, for example, nickel. For example, given a spraying with a solution of 5% NaCl, an endurance of less than 100 hours will result in a nickel-coated part, while the aluminum-coated part resists corrosion for more than 1000 hours.

The behavior is otherwise when the environment is not air containing salt, but rather is a particularly humid environment at a relatively warm temperature. In a corrosion test at an ambient temperature of 85° C. and a relative air humidity of 85%, the typical results for nickel-coated magnets is an endurance of 1000 hours, while the endurance for an aluminum-coated magnet is only 500 hours. Similar behavior is found in what is called a HAST test, wherein HAST stands for "highly accelerated steam test". Here, an atmosphere containing steam is used with a temperature of 130° C. at a pressure of 2.5 bar. In an atmosphere of this sort, a nickel-coated part has an endurance of 50 to 100 hours, while the endurance for an aluminum-coated part is less than 50 hours.

For many applications, in particular in the automotive field, a coating is, however, required that exhibits both endurance in humid environments and resistance to air containing salt. Requirements of this sort with regard to resistance to corrosion were previously met by manufacturing the parts with a double-coating. Here, for example a layer of greater than 20 µm of nickel and a layer of greater than 20 µm tin were deposited on the parts to be protected, for example, a NdFeB magnet.

However, a double-coating of this sort has the disadvantage that it requires a significantly higher economic outlay. Due to the necessarily greater thickness of the non-magnetic layers, the portion of the magnetically effective material relative to the total volume is lower, so that allowances have to be made with regard to magnetic characteristics in the magnetic system and allowances also have to be made in the tolerance that can be realized for the magnets.

SUMMARY OF THE INVENTION

The object of the present invention is to provide a method that will improve the resistance to corrosion for an aluminum-coated part, particularly magnets, in a way that a significantly higher resistance to corrosion is achieved, not only in relation to air containing salt, but also in humid climates.

This method is obtained for improving protection against corrosion of surfaces that are coated with a material selected from a group consisting of aluminum and alloys consisting predominantly of aluminum, which method comprises subjecting the parts with the coated surface to a heat treatment at a temperature of between 400° C. and the melting point of the coating material.

DESCRIPTION OF THE PREFERRED EMBODIMENTS

The principles of the present invention are particularly useful when incorporated in a heat treatment which lies below the melting point of the aluminum or aluminum alloy being used for the coating. Preferably, the treatment is in a range of 450° C. and 550° C., and the duration of the heat treatment should typically amount to 1 to 3 hours. With a heat treatment of this type, an endurance of more than 1000 hours is achieved in a test at a temperature of 85° C. and a relative humidity of 85%. Also, in a HAST test, endurances are achieved as with parts coated with nickel, in the region of 100 hours.

It has been established that even magnets with defects or damage in the layer exhibit only a thin layer of red rust, without the onset of the powdery decay of the magnet that would otherwise be caused by corrosion. Thus, by means of the inventive method, it is also possible to continue to use coated magnets with flaws in the coating without a scrapping being necessary, due to the risk of premature corrosion.

The heat treatment can occur both in air and in protective or inert gases. A measurement of the magnetic value has shown that the heat treatment causes no change in the magnetic characteristics.

In an exemplary embodiment, 10 coated magnets were divided into two groups of five magnets each. The first group was exposed to a heat treatment of 1 hour at 500° C. in air and a second group was not heat treated. A comparative magnetic measurement yielded no differences before and after the heat treatment. Both groups were then exposed to a HAST test at 130° C. and a pressure of 2.7 bar. Already after 16 hours, the second group of magnets, which were not heat treated, begin to develop a slight delamination, for example, the beginning of the dissolving of the layer. After 32 hours, all five magnets of the second group, which were not heat treated, were highly corroded, having coating delamination and powdery decay of the magnets. In contrast thereto, all five magnets of the first group which were heat treated, and which were NdFeB magnets, still showed no signs of corrosion, even after 100 hours of exposure.

Although various minor modifications may be suggested by those versed in the art, it should be understood that I wish to embody within the scope of the patent granted hereon all such modifications as reasonably and properly come within the scope of my contribution to the art.

I claim:

1. A method for improving the protection against corrosion of a surface of a magnet which contains rare earths and is coated with a coating material selected from the group consisting of aluminum and alloys consisting predominantly of aluminum, said method comprising providing the magnet with a coated surface, and heat-treating the magnet with the coated surface for at least one hour at a temperature between 450° C. and 550° C. and below the melting temperature of the coating material.

2. A method according to claim 1, wherein the step of providing the magnet provides an aluminum-coated NdFeB magnet.

3. A method according to claim 2, wherein the step of providing the NdFeB magnet includes coating the magnet with a layer of aluminum using an ion plating process.

4. A method according to claim 1, wherein the step of providing a magnet provides a magnet containing iron and rare earths.

5. A method for improving the protection against corrosion of a surface of a magnet which contains rare earths and is coated with a coating material selected from the group consisting of aluminum and alloys consisting predominantly of aluminum, said method comprising providing the magnet with a coated surface, and heat-treating the magnet with the coated surface for at least 1 hour at a temperature between 450° C. and 550° C.

6. A method for improving the protection against corrosion of a surface of a NdFeB magnet, said method comprising the steps of providing a NdFeB magnet, coating the surfaces of the magnet with a coating material selected from the group consisting of aluminum and alloys consisting predominantly of aluminum, and then heat-treating the magnet with the coating material for at least one hour at a temperature between 450° C. and 550° C. and below the melting temperature of the coating material.

7. A method according to claim 6, wherein the step of coating is by using an ion plating process.

* * * * *